United States Patent [19]

Berndlmaier et al.

[11] Patent Number: 5,053,851
[45] Date of Patent: Oct. 1, 1991

[54] METAL BUMP FOR A THERMAL COMPRESSION BOND AND METHOD FOR MAKING SAME

[75] Inventors: Erich Berndlmaier, Wappingers Falls; Gobinda Das, Hopewell Junction, both of N.Y.; Thomas L. Viau, Milton, Vt.

[73] Assignee: International Business Machines Corp., Armonk, N.Y.

[21] Appl. No.: 686,765

[22] Filed: Apr. 17, 1991

Related U.S. Application Data

[62] Division of Ser. No. 640,658, Jan. 14, 1991.

[51] Int. Cl.⁵ ............................................. H01L 23/48
[52] U.S. Cl. ........................................ 357/68; 357/69; 357/71; 437/183
[58] Field of Search ................ 357/68, 69, 71; 437/183

[56] References Cited

U.S. PATENT DOCUMENTS

| | | | |
|---|---|---|---|
| 3,415,680 | 12/1968 | Perri et al. | 117/212 |
| 3,508,118 | 4/1970 | Merrin et al. | 317/101 |
| 3,716,907 | 2/1973 | Anderson | 437/183 |
| 3,874,072 | 4/1975 | Rose et al. | 437/183 |
| 4,042,954 | 8/1977 | Harris | 357/71 |
| 4,205,099 | 5/1980 | Jones et al. | 437/183 |
| 4,263,606 | 4/1981 | Yorikane | 357/68 |
| 4,427,715 | 1/1984 | Harris | 427/96 |
| 4,434,434 | 2/1984 | Bhattacharya et al. | 357/71 |
| 4,970,571 | 11/1990 | Yamakawa et al. | 357/71 |

FOREIGN PATENT DOCUMENTS

| | | | |
|---|---|---|---|
| 45-39212 | 12/1970 | Japan | 357/68 |
| 52-40973 | 3/1977 | Japan | 357/68 |
| 57-73953 | 5/1982 | Japan | 437/183 |
| 57-92850 | 6/1982 | Japan | 437/183 |
| 60-180147 | 9/1985 | Japan | 437/183 |

Primary Examiner—Andrew J. James
Assistant Examiner—Courtney A. Bowers
Attorney, Agent, or Firm—Perman & Green

[57] ABSTRACT

A structure for bonding to a conductive pad on a semiconductor substrate is described. The structure comprises a glassy passivating layer with a thickness of at least 3 microns deposited over the conductive pad. The passivating layer defined an aperture which exposes a portion of the conductive pad. A metal bump covers the portion of the conductive pad exposed in the aperture and further extends over the edges of the glassy passivating layer so as to form a seal between the conductive pad and the glassy passivating layer. A subsequent thermal compression bonding operation on such structure does not cause fractures in the glassy passivating layer due to its thickness.

8 Claims, 1 Drawing Sheet

METAL BUMP FOR A THERMAL COMPRESSION BOND AND METHOD FOR MAKING SAME

This is a divisional of copending application Ser. No. 07/640,658, filed on Jan. 14, 1991.

FIELD OF THE INVENTION

This invention relates to metal lead bonding to semiconductor structures, and more particularly to a metal bump structure particularly adapted to thermal compression bonding between a beam lead and a semiconductor chip's contact land.

BACKGROUND OF THE INVENTION

The use of metal bumps to bond external metal beam leads to contact patterns on semiconductor chips is well known in the art Beam lead bonding, flip-chip bonding, and tape automated bonding (TAB), for example, comprise examples of semiconductor chip mounting processes that utilize metal bumps formed over selected regions of the wiring pattern on a chip. In thermal compression bonding, a combination of heat and physical pressure is used to bond metal bumps on the chip to external metal connections. Those external connections can be provided, for example, on an external chip or a flexible tape, and positioned so as to be in facing relationship to the metal bumps.

Referring to FIG. 1 a prior art bump/chip structure is shown which has been found to present potential corrosion problems leading to chip malfunction. A semiconductor substrate 10 has formed thereon a conductive contact land 12 to which a metal bump 14 is affixed.

A glassy, passivating layer 16 overlays the surface of substrate 10. During the processing of substrate 10, an opening is etched in layer 16 by placing a mask on its upper surface, followed by an etch. The etched opening has generally been made somewhat larger in cross section than bump 14 in order to assure that the bump, when it is deposited, is seated squarely on contact land 12.

The composition of bump 14 includes a bonding layer 20 of chromium on which an aluminum pedestal 22 was deposited. Next, an additional layer of chromium 24 is laid down upon the uppermost surface of aluminum pedestal 22, followed by layers of copper 26 and gold 28.

As a consequence of this structure exposed collar areas 18 were created where corrosion could attack the uppermost surface of contact land 12. While attempts have been made to passivate collar region 18 through the application of polymeric overcoats, the results have not been totally satisfactory.

Other prior art showing methods for forming bumps on conductive lands on semiconductors can be found in U.S. Pat. Nos. 4,042,954, 4,427,715, and 3,874,072. In U.S. Pat. No. 4,042,954 to Harris there is shown a method for forming metal bumps which utilizes a multilayer transition structure of Cr, AlCr, Cr and Au. This transition structure is used to connect a nickel-under-copper bump to an aluminum metal pattern on a semiconductor chip. The aluminum metal pattern contacts selected regions on the chip through an $SiO_2$ passivating layer.

In U.S. Pat. No. 4,427,715 to Harris, another method is shown for forming metal bumps wherein a bump is centered over a pad so as to cover a window in an intermediate passivating layer. The positioning and size of the bump is selected relative to the pads such that during thermal compression bonding, the periphery of the bump does not extend over the periphery of the pad. This arrangement is purported to prevent failures caused by cracking in the passivating layer.

In U.S. Pat. No. 3,874,072 to Rose et al., a method is shown for forming mushroom-shaped metal bumps which incorporates multiple layers of varying metals. Briefly, a nickel mushroom cap is bonded to an aluminum layer through intervening nickel, chromium layers respectively. The aluminum layer is deposited on an aluminum pad through a window in a thin glass passivating layer. Thin layers of gold tin and gold are formed sequentially over the nickel cap.

The above patents suffer from a number of disadvantages. Some do not anticipate the corrosion problems which may occur due to either a lack of a good bond between an aluminum bump and an underlying insulating structure or from exposed contact land metallurgy. Others do not anticipate that the misalignment of a bump can cause cracking of an underlying passivating layer.

In summary, there is a need in the art for a metal bump process, useful in thermal compression bonding which is both inexpensive to manufacture, inhibits corrosion due to exposed metallurgy, and maintains optimum sub-bump structures.

Accordingly, it is an object of this invention to provide a new and improved metal bump for use in thermal compression bonding processes on semiconductor chips.

It is another object of this invention to provide an improved method for manufacturing interconnecting metal bump structures wherein passivation layer cracking is avoided.

It is still another object of this invention to provide a metal bump structure that does not leave regions which expose underlying contact metallurgy which is corrosion-sensitive.

It is yet another object of this invention is to provide a metal bump/semiconductor structure wherein a glassy passivating layer may be employed.

SUMMARY

A structure for bonding to a conductive pad on a semiconductor substrate is described. The structure comprises a glassy passivating layer with a thickness of at least 3 microns deposited over the conductive pad. The passivating layer defines an aperture which exposes a portion of the conductive pad. A metal bump covers the portion of the conductive pad exposed in the aperture and further extends over the edges of the glassy passivating layer so as to form a seal between the conductive pad and the glassy passivating layer. A subsequent thermal compression bonding operation on such structure does not cause fractures in the glassy passivating layer due to its thickness.

DETAILED DESCRIPTION OF THE INVENTION

Figure 1:
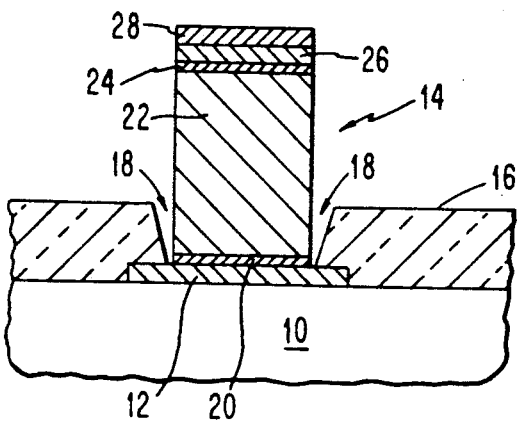
FIG. 1 is a sectional view of a prior art conductive bump/semiconductor structure.
Figure 2:
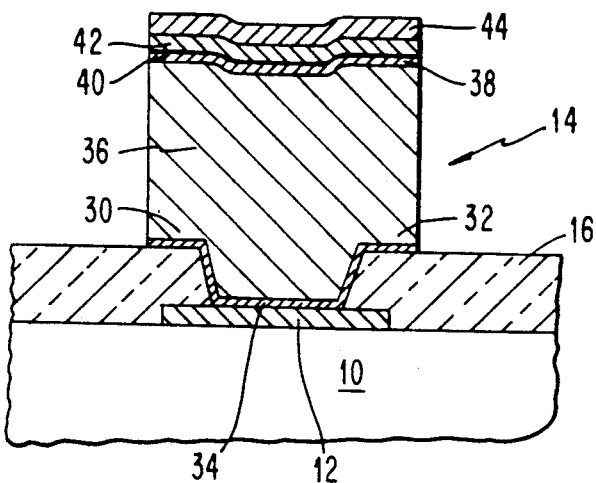
FIG. 2 is a sectional view of a preferred embodiment of the invention.

As techniques for the fabrication of monolithic semiconductor devices are well known, it is assumed that the production of semiconductor devices in substrate 10 has already been accomplished and that pads 12 have been emplaced around the periphery of the chip. In FIG. 2, a cross section of a single pad 12 is shown emplaced on semiconductor chip 10. While the metallurgy of pad 12 may be comprised of a number of metal components, it is preferred that it comprise an aluminum/-copper mixture that is evaporated onto the surface of chip 10.

Subsequent to the deposition of pad 12, a passivating layer of insulating quartz 16 is deposited over the entire upper surface of substrate 10. The thickness range of quartz layer 16 is preferably approximately 3 to 4 microns but may be greater. The preferred method for depositing quartz layer 16 is via sputtering.

An opening or window is made in quartz layer 16 over pads 12, by superimposing a mask over quartz layer 16 and then subsequently etching an opening to the surface of pad 12. The openings through quartz layer 16 are called via-holes and are placed around the periphery of the chip in order to facilitate subsequent thermal compression bondings to inner leads of a TAB tape.

Subsequently, a molybdenum mask having openings around its periphery that are aligned with the via holes is emplaced over quartz passivating layer 16. The holes in the mask are sufficiently wide to not only expose the via holes but also shoulder areas 30 and 32 which surround each via hole. An aluminum bump structure 14 is then deposited through the molybdenum mask via a series of evaporation steps. Aluminum bump structure 14 comprises an adhesion layer of chromium 34 which extends not only over the exposed portion of land 12, but also up the side walls of the via hole and over shoulder areas 30 and 32. Chromium layer 34 is preferably approximately 1250 angstroms thick and adheres well to both the metallurgy of land 12 as well as covered areas of quartz layer 16.

Subsequently, an aluminum bump pedestal 36 is deposited on chromium layer 34 to a thickness of approximately 18.65 microns +/−2.5 microns, followed by an additional layer of chromium 38. Nexr, a thin composite adhesion-promoting layer of chromium/copper 40 is deposited on chromium layer 38 and is followed by an approximately one micron layer of copper 42. Finally, a 4500 Angstrom layer of gold 44 is deposited on the uppermost surface of the pedestal and forms the bonding surface for the bump.

Layer 34 of chromium provides enhanced adhesion between aluminum bump 36 and the metallurgy of pad 12 and quartz layer 16. Thus, during thermal compression bonding or subsequent thermal cycling, the bumps are prevented from shearing-off through the adhesive properties of chromium interlayer 34. Chrome layer 38 acts as a diffusion barrier between aluminum bump 36 and copper layer 42 so that aluminum/copper alloy formation is prevented which is potentially corrodible. Finally, the intermixing layer of copper and chromium in layer 40 promotes the adhesion of copper onto the chromium layer.

After bump deposition, chip 10 is placed on an anvil and has its contacts aligned with the inner leads of a TAB tape. Generally, such leads are comprised of copper which have been plated with a thin layer of gold. Then, a thermode is brought down upon the inner leads, pressing them against the aluminum bumps and, through a combination of heat, pressure and time, all of the leads are bonded at one time. The thermode temperature is preferably maintained between 550° C.–700° C. with a dwell time of 0.3 to 0.9 seconds. The anvil temperature is maintained at 250° C. It is preferred that the pressure exerted between the bump and inner lead approximate 45,000 psi during bonding, but this may vary between 31,000 to 59,000 psi. It should be understood that shoulder 30 and 32 of bump 14 can either extend significantly past the extent of contact land 12 or be smaller than contact land 12. In both cases, it is the thickness of quartz layer 16 which prevents cracking that might otherwise occur under the conditions above-described.

Figure 3:
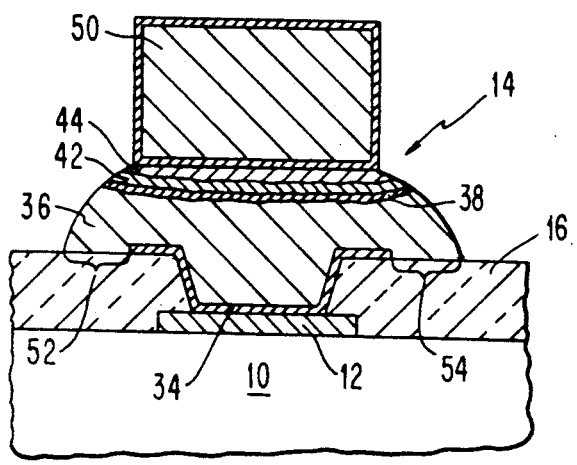
FIG. 3 is a sectional view of the conductive bump/semiconductor structure shown in FIG. 2, after thermal compression bonding.

Referring now to FIG. 3, a section of an inner lead 50 is shown subsequent to thermal compression bonding to metal bump 14. The amount of travel between the anvil and the thermode to achieve bonding is adjusted so that the bump 14 is flattened by approximately 30%–40% of its original height (6 microns +/−2 microns). As a result, the bumps become smooth at the top and expand laterally at the bottom, and the gold layer of lead 50 bonds with gold layer 44 of the bump 14, forming a strong interface. Under the conditions described, a bond strength of 50–80 grams per lead is easily achieved.

A significant consequence of causing the bump to extend over shoulder areas 30 and 32 of quartz layer 16, is the possible susceptibility of quartz layer 16 to cracking during thermal compression bonding. It has been found that as long as the deformation of the aluminum bump does not exceed 40%, the expanding of the aluminum bump over a thick quartz shoulder (greater than 3 microns in thickness) acts as a stress cushion so that the deflection of quartz layer 16 is negligible. If quartz layer 16 is too thin, under these conditions, it will crack and will cause potential device failure.

Figure 4:
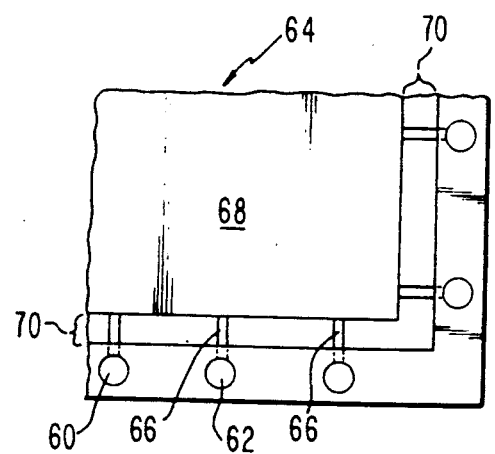
FIG. 4 is a plan view of a section of a semiconductor chip which illustrates an active circuit-free area surrounding the bump regions.

A consequence of the extension of bumps over quartz layer 16 is the exposure of underlying semiconductor structures to the heat and stress of thermal-compression bonding. It has been found that if active semiconductor structures are present under areas 52 or 54 of the collapsed portion of aluminum bump 14 or under the contact area between bump 14 and contact land 12, that damage can occur to underlying active structures. In this regard, FIG. 4 shows a plurality of bumps 60, 62, etc. around the periphery of a semiconductor chip 64 (only a corner of the chip is shown). The chip contact land areas lying beneath each of bumps 60 and 62 are connected via conductive pathways 66 to area 68 which contains the active semiconductor devices. A band area 70 is provided between bumps 60, 62, etc. wherein no active circuits are present, except conducting pathways 66. Thus, thermal compression bonding is prevented from damaging underlying active circuits, due to their absence from band area 70. It has been determined that if the bumps are separated from the active devices by a border of 20 microns or greater (in any direction), then the effects of thermal compression bonding on the active devices is negligible. Obviously, if a method of interconnection is chosen wherein a tape lead is bonded to pad by melting a portion of the bump and the tape lead material at a relatively low temperature, the affects of stress and temperature on device parameters are negligible.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

We claim:

1. A bond structure affixed to a conductive pad on a semiconductor chip, said bond structure comprising:
   a glassy passivating layer having a thickness of at least approximately 3 microns over said chip, said passivating layer defining an aperture exposing a portion of said conductive pad; and
   a deformable metal bump having a predetermined initial height and covering the portion of said conductive pad exposed in said aperture and extending over an edge of said glassy passivating layer and deformed so that its height is reduced by approximately 30% to 40% of said predetermined initial height, to thereby expand and further extend over said glassy passivating layer.

2. The structure as recited in claim 1 wherein, no active device structures are positioned in said semiconductor chip beneath portions of said deformed metal bump that extend over said edge.

3. The structure as recited in claim 2 further comprising:
   a layer of chromium interposed between said metal bump and said exposed conductive pad and covering said edge of said glassy passivating layer.

4. The structure as recited in claim 3 wherein said glassy passivating layer is sputtered quartz.

5. The structure as recited in claim 4 wherein said quartz has a thickness in the range of 3 to 4 microns.

6. The structure as recited in claim 5 wherein said metal bump includes an aluminum pedestal bonded to said chromium layer.

7. The structure as recited in claim 6 wherein said aluminum pedestal has additional layers of chromium, copper, and gold disposed on its uppermost surface.

8. The structure as recited in claim 7 wherein said deformable metal bump has a thickness, before deformation, in the range of from approximately 16 to 21 microns.

* * * * *